United States Patent
Gasquet et al.

(10) Patent No.: US 9,449,713 B2
(45) Date of Patent: Sep. 20, 2016

(54) METHOD FOR PRECONDITIONING THIN FILM STORAGE ARRAY FOR DATA RETENTION

(75) Inventors: Horacio P. Gasquet, Austin, TX (US); Brian A. Winstead, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 361 days.

(21) Appl. No.: 13/532,973

(22) Filed: Jun. 26, 2012

(65) Prior Publication Data

US 2013/0343112 A1   Dec. 26, 2013

(51) Int. Cl.
| | |
|---|---|
| *G11C 5/02* | (2006.01) |
| *G11C 29/06* | (2006.01) |
| *H01L 21/28* | (2006.01) |
| *H01L 29/423* | (2006.01) |
| *G11C 16/04* | (2006.01) |

(52) U.S. Cl.
CPC ......... *G11C 29/06* (2013.01); *H01L 21/28273* (2013.01); *H01L 29/42332* (2013.01); *G11C 16/0416* (2013.01); *G11C 2216/06* (2013.01)

(58) Field of Classification Search
CPC ............. G11C 29/06; G11C 2216/06; G11C 16/0416; H01L 21/28273; H01L 29/42332
USPC ............. 365/51, 201, 200, 230.05, 226, 222
See application file for complete search history.

(56) References Cited

U.S. PATENT DOCUMENTS

| | | | | |
|---|---|---|---|---|
| 5,883,008 | A * | 3/1999 | McClure | 438/737 |
| 7,764,550 | B2 | 7/2010 | Suhail et al. | |
| 2001/0046168 | A1* | 11/2001 | Barth et al. | 365/201 |
| 2008/0298156 | A1* | 12/2008 | Yoshinaga et al. | 365/226 |
| 2011/0075482 | A1 | 3/2011 | Murphy et al. | |

* cited by examiner

*Primary Examiner* — Richard Elms
*Assistant Examiner* — Mohammed A Bashar

(57) ABSTRACT

A method includes over-programming thin film storage (TFS) memory cells on a semiconductor wafer with a first voltage that is higher than a highest voltage used to program the memory cells during normal operation of the memory cells. With the memory cells in an over-programmed state, the wafer is exposed to a first temperature above a product specification temperature for a period of time sufficient to induce redistribution of charge among storage elements in the memory cells.

20 Claims, 4 Drawing Sheets

METHOD FOR PRECONDITIONING THIN FILM STORAGE ARRAY FOR DATA RETENTION

BACKGROUND

1. Field

This disclosure relates to thin film storage arrays, and more particularly for preconditioning the thin film storage array for data retention.

2. Related Art

Non-volatile memories (NVMs), which can be programmed and erased, have historically mostly used floating gates made of polysilicon to store charge. More recently, NVM cells that use thin film storage (TFS), which use thinner layers than polysilicon layers for charge storage, have been demonstrated to be manufacturable. Exemplary TFS cells are nanocrystals, silicon nitride, and combinations of these with other dielectrics such as oxide and high k dielectrics. The nanocrystal approach uses very small discrete elements that are isolated from each other and that individually store charge. The other type is a continuous layer that stores charge that is intended to stay in a fixed location within the continuous layer. In the case of a polysilicon floating gate, the charge moves relatively freely within the polysilicon floating gate. In the case of all NVMs is the issue of data retention which is the amount of time a memory cell maintains its charge sufficiently to be read successfully. This typically goes down with the number of program/erase cycles that are performed. Data retention, as the number of cycles increases, has been sought to be improved by improving processes to reduce defects and provide layers that require lower voltages or are more durable with higher voltages. Another avenue in pursuit of improved data retention has been to improve cell design. Another possibility is improved circuit design.

Accordingly there is a need to provide methods that improve data retention for NVM that may be programmed and erased.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A method for preconditioning thin film storage (TFS) cells employs over-programming all of the TFS cells and then baking the TFS cells while they are over-programmed. The TFS cells may then be tested to verify that they meet the specifications. The result has been that the TFS cells, after significant program/erase cycling have improved data retention compared to those that do not use the method. This is better understood by reference to the drawings and the following written description.

Figure 1:
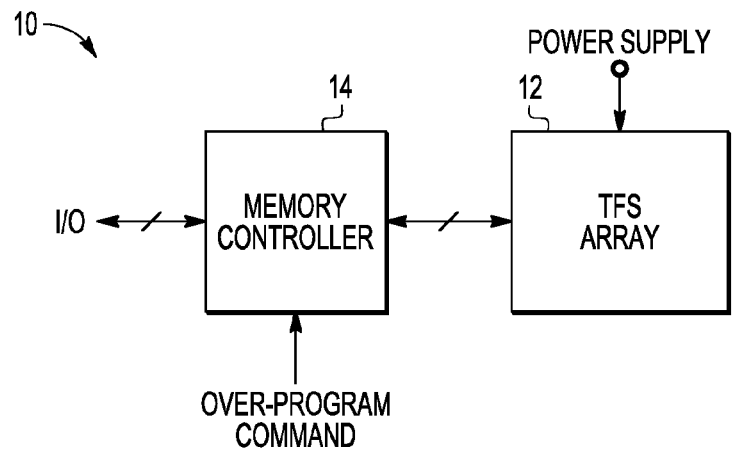
FIG. 1 is a block diagram showing a thin film storage (TFS) array and a memory controller that may be used to perform a method on the TFS array according to an embodiment.

Shown in FIG. 1 is a memory 10 having a TFS array 12 that receives a power supply voltage and a memory controller 14 coupled to TFS array 12 and also provides the input and output of the TFS memory as well as receiving and providing other signals, such as control inputs, and receiving addresses. TFS array has TFS cells arranged in rows and columns that forms an array. Memory controller 14 controls the operation of TFS array to perform memory operations which in this case include programming, erase, and read. In response to an over-program command, memory controller 14 causes all of the TFS cells in TFS array to be programmed to a higher threshold voltage than is normally done for a programming step. For example, the target threshold voltage for programming may be 2.8 volts whereas the over-programming threshold may be 3.5 volts. Over-programming, thus, is a type of programming in which a TFS cell is programmed to a higher threshold voltage than it would if normal programming was performed. More charge enters the TFS of the cell than would if normal programming was performed. This can be done by providing more program pulses or providing program pulses at a higher voltage. An effective target for charge differential between normal programming and over-programming is 30 percent but a lower percentage, for example 10 percent, may also be effective. The overprogramming can be achieved in more than one way. One way is to use a higher voltage than a highest voltage used to program the memory cells during normal operation. Another way is to apply programming pulses for a longer duration than is used to program memory cells during normal operation.

Figure 2:
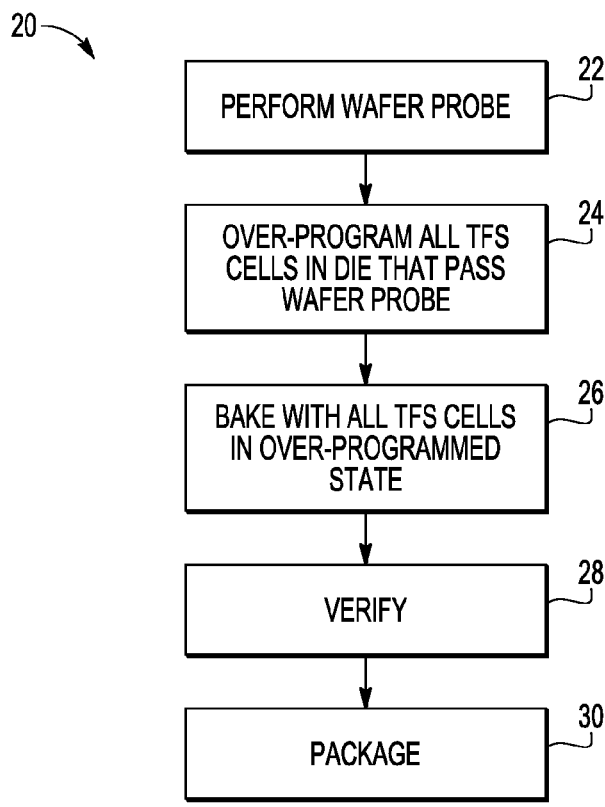
FIG. 2 is a flow for performing the method.

Shown in FIG. 2 is flow diagram 20 describing a method that preconditions the TFS cells of TFS array 12 for improved data retention. It should be recognized that in the semiconductor industry, circuits such as shown in FIG. 1 are in semiconductor die of which there are many on a wafer. Shown in step 22 is a step of performing a wafer probe in which circuits such as memory 10 are tested to verify that they meet an initial standard for functionality. The ones that meet the standard may be reference as good die. In step 24, the TFS array 12 in each good die has all of the TFS cells over-programmed. With each TFS array 12 having its TFS cells all over-programmed, the TFS cells are subjected to a bake. One known effective bake is 250 degrees Celsius for 24 hours. A lower temperature and less time can also be effective. For example, one hour at 200 degrees is believed to provide a positive effect which may be of sufficient value in some circumstances. Also temperature may be increased to decrease the time, or time may increased to decrease temperature. After bake 26 and at step 28, the die are tested again to verify their functionality including TFS array 12 in each good die. After verify step 28, singulating is performed. The wafer is singulated so that the die can be packaged as shown in step 30. The package can take many forms. In some cases, the die may not be separately packaged but packaged with other die or even simply mounted directly onto a product without any separate packaging. After method 20, TFS array functions normally so that programming is at the normal levels. The TFS cells have been preconditioned to provide better data retention. This is particularly true after many, for example ten thousand, program/erase cycles in which data retention is significantly improved.

Figure 3:
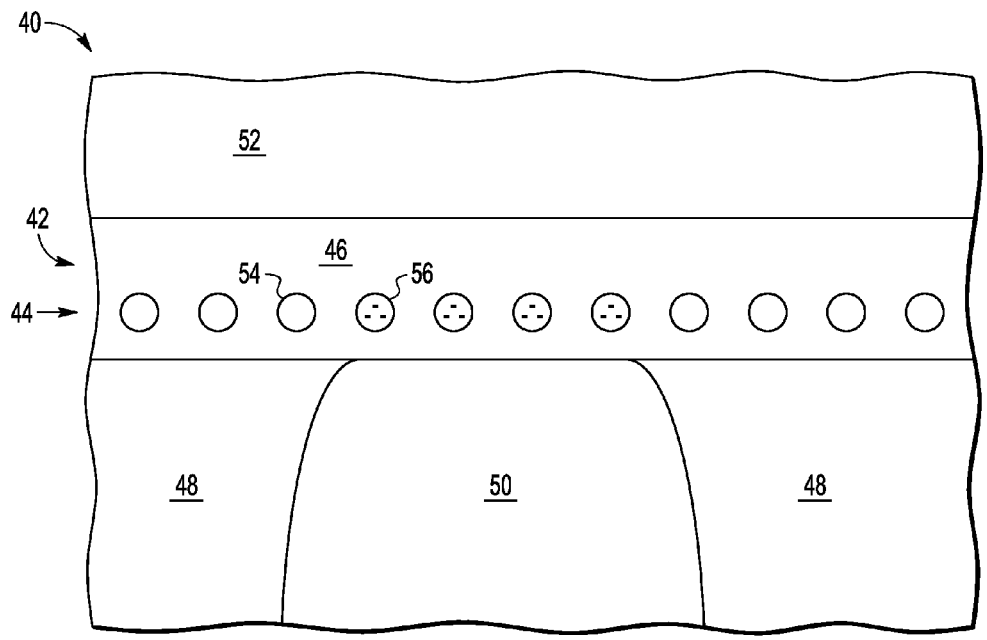
FIG. 3 is a cross section of a TFS cell at a stage in the method according to a theory.

A theory for this effect is that during the bake after over-programming, electrons move laterally to uncharged locations where the thin film is not charged by programming or even over-programming. These uncharged locations become partially charged and retard subsequent lateral electron movement from the locations that are intended to be charged. Shown in FIG. 3 is a TFS cell 40 after normal programming but prior to over-programming. TFS cell 40 has an isolation region 48 surrounding an active region 50. Over isolation region 48 and active region 50 is a TFS layer 42 having a plurality of nanocrystals 44 surrounded by an oxide 46. Plurality of nanocrystals 44 includes a nanocrystal 54 over isolation 48 and a nanocrystal 56 over active region 50. During programming, if hot carrier injection is used, current will flow under nanocrystal 56 but not under nanocrystal 54. The result is that nanocrystal 56 as well as the other nanocrystals over active region 50 will accumulate electrons during programming the nanocrystals over isolation 48 will not. If there is some electron accumulation of electrons in the nanocrystals over isolation 48, such accumulation will be much smaller than that for nanocrystals over active region 50.

Figure 4:
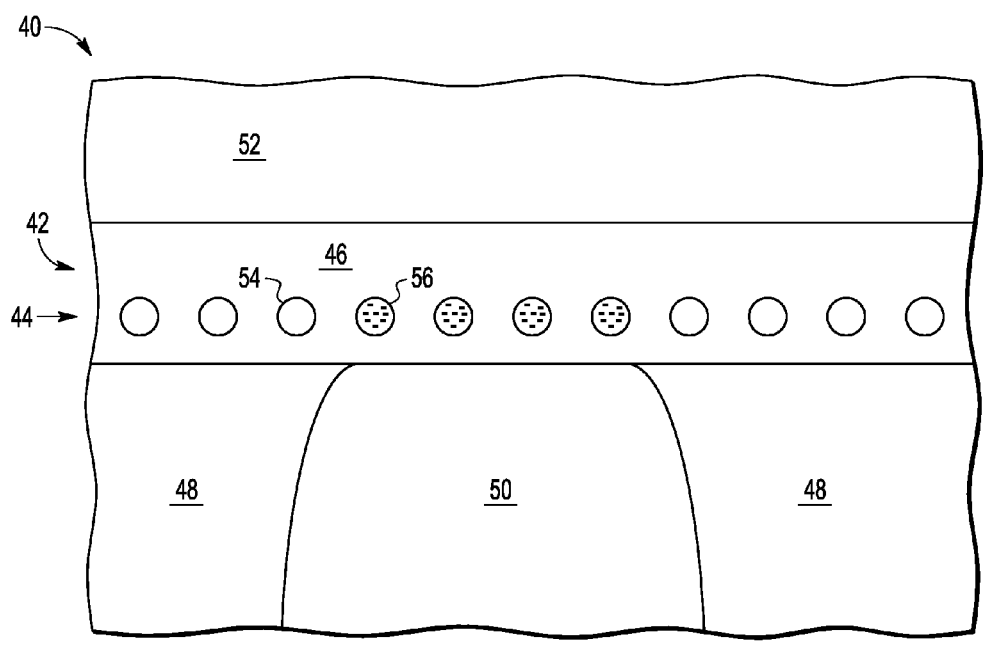
FIG. 4 is a cross section of the TFS cell at a stage in the method subsequent to that shown in FIG. 3 and according to the theory.

Shown in FIG. 4 is TFS cell 40 after over-programming in which additional electron accumulation occurs in the nanocrystals, such as nanocrystal 56 over active region 50. Similarly, nanocrystals such as nanocrystal 54 over isolation 48 do not further accumulate electrons.

Figure 5:
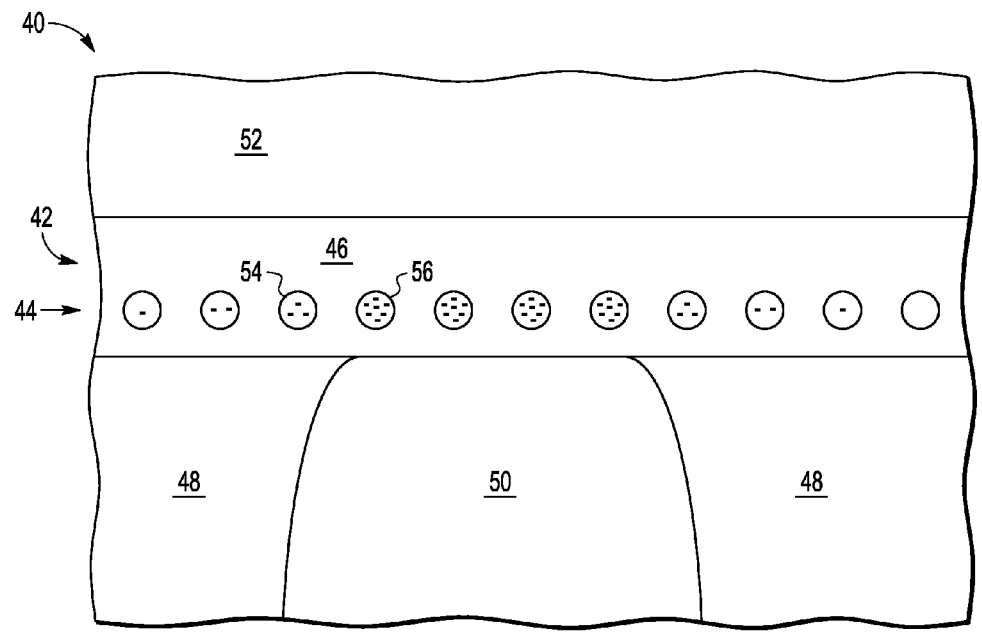
FIG. 5 is a cross section of the TFS cell at a stage in the method subsequent to that shown in FIG. 4 and according to the theory.

Shown in FIG. 5 is TFS cell 40 after performing bake 26 of FIG. 2. This bake is believed to cause some electrons to be removed from the nanocrystals over active region 50. Some of these electrons that have left their nanocrystal due to bake 26 are believed to accumulate in the nanocrystals over isolation 48 including nanocrystal 54. Accumulation in the nanocrystals over isolation 48 is believed to be strongest in the nanocrystals adjacent to active region 50. Nanocrystal 54 is such an example. The nanocrystals farthest from active region 50 may not have any discernible accumulation of electrons. A benefit is believed to occur when the median charge of the nanocrystals over isolation region 48 and adjacent to the nanocrystals over active region 50 is at least 10% of the median charge for the nanocrystals over active region 50 when the nanocrystals over active region 50 are programmed. Nanocrystal 54 is an example of a nanocrystal that is adjacent to the nanocrystals over active region 50.

Figure 6:
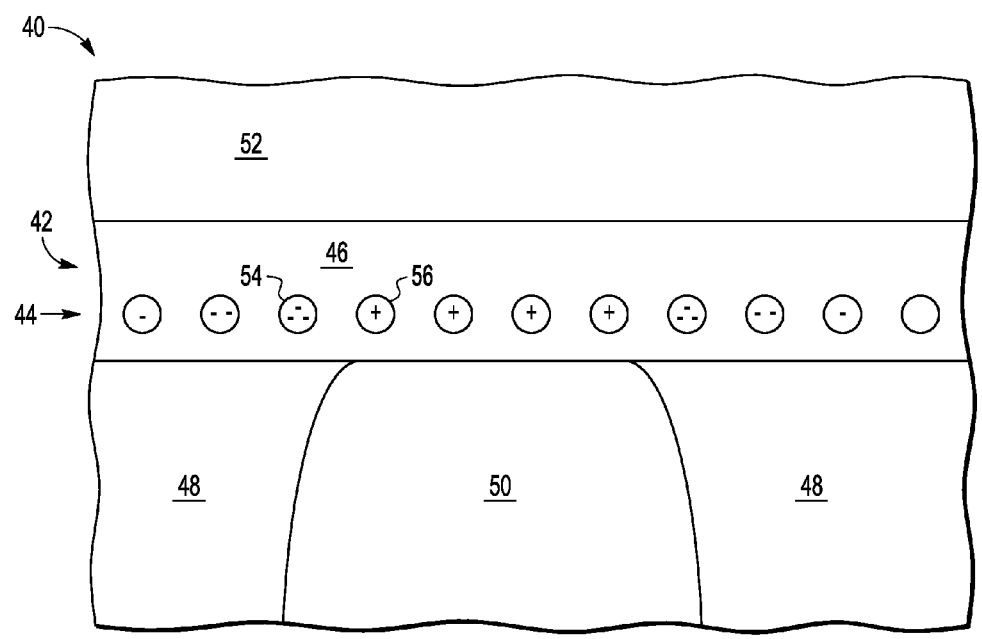
FIG. 6 is a cross section of the TFS cell at a stage in the method subsequent to that shown in FIG. 5 and according to the theory.

Shown in FIG. 6 is a TFS cell after a step of erasing TFS cell 40 which results in the nanocrystals over active region 50 becoming slightly positively charged while the nanocrystals over isolation region 48 remaining substantially unchanged. Barring a subsequent bake, the charge in the nanocrystals over isolation region 48 will remain unchanged. Thus with subsequent program/erase cycles, the nanocrystals over isolation region 48 retain their charge. The result then is that charge is present laterally from the nanocrystals that do change state, which are the nanocrystals over active region 50. The lateral charge present in nanocrystal 54 is thus a deterrent for electrons to leave nanocrystal 56; at least a deterrent in the direction of nanocrystal 54.

Figure 7:
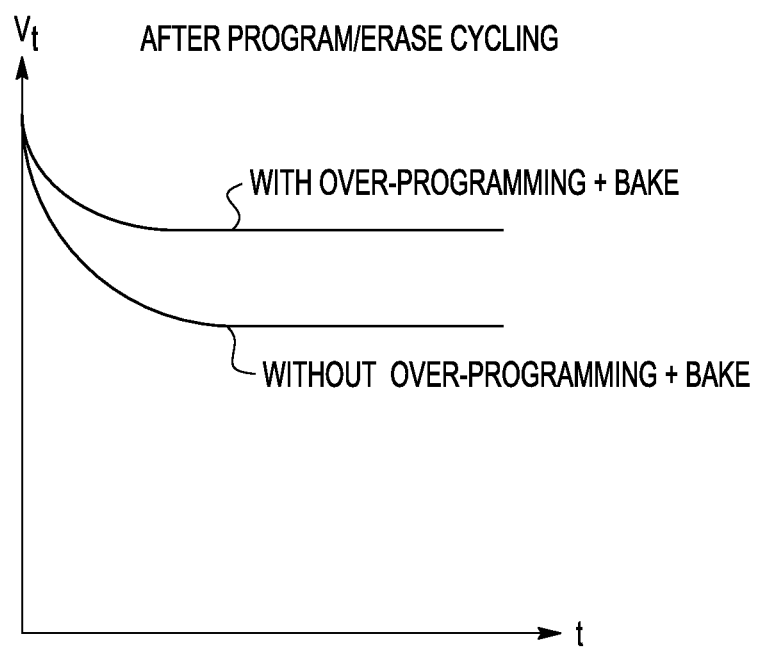
FIG. 7 is a diagram showing a result of the method compared to not using the method.

The result, whether the theory is correct or not, is shown in FIG. 7 which shows that after substantial program erase cycling, there is a significantly less drop in threshold voltage over time for the TFS cell having been preconditioned by the over-programming and bake as there is for TFS cell not having experienced the over-programming and bake. The result is a significant improvement in data retention after program/erase cycling by using the over-programming plus bake process.

The result is expected to similar for thin film approaches other than nanocrystals due to the similarity of the regions in the thin film over isolation not being areas where there is significant change in charge with program/erase cycles. During the bake, charge should laterally extend to the isolation regions where it should be retained and thus have the beneficial effect of retarding charge escaping from over the active region.

Most commonly a memory cell in an array of memory cells such as TFS array 12 is in one of two logic states, but in some memories a cell may have more than two logic states. For example, a memory cell may be in one of four possible normal logic states. Such memory cells are called multi-bit cells. Four normal logic states would be equivalent to two bits. In such case, overprogramming would be to a threshold voltage greater than that of the normal logic state having the highest threshold voltage of the normal logic states.

By now it should be appreciated that there has been provided a method that includes over-programming thin film storage (TFS) memory cells on a semiconductor wafer with a first voltage that is higher than a highest voltage used to program the TFS memory cells during normal operation of the memory cells. The method further includes, before singulating the semiconductor wafer into individual die and with the TFS memory cells in an over-programmed state, exposing the semiconductor wafer to a first temperature above a product specification temperature for a period of time sufficient to induce redistribution of charge among storage elements in the TFS memory cells. The method may have a further characterization by which the period of time is inversely proportional to the temperature. The method may further include probing the wafer to determine whether any of the TFS memory cells are defective before the over-programming the TFS memory cells. The method may have a further characterization by which the over-programming is performed on the TFS memory cells at least 30% above normal operating levels during customer use. The method may further include verifying data retention capability of at least some of the TFS memory cells after the exposing the wafer to the first temperature. The method may further include singulating the semiconductor wafer into a plurality of individual die. The method may have a further characterization by which the first temperature is at least a maximum specification temperature during which the individual die will be used. The method may have a further characterization by which the first temperature is at least 175 degrees Celsius.

Also disclosed is a method that includes over-programming charge storage elements in memory cells on a semiconductor wafer at one of the group consisting of: a first voltage and a first time duration, wherein the first voltage is greater than a maximum voltage that is specified to program the charge storage elements during normal operation and the first time duration is greater than a maximum time that is specified to program the charge storage elements during normal operation. The method further includes, after the over-programming, exposing the semiconductor wafer to an elevated temperature for a second time duration, wherein the elevated temperature is at least as high as a maximum operating temperature for die on the semiconductor wafer. The method may further include probing the semiconductor wafer to detect defective memory cells on the semiconductor wafer before the over-programming, wherein the over-programming is performed on memory cells that are not defective. The method may have a further characterization by which the memory cells are in an over-programmed state when the semiconductor wafer is exposed to the elevated temperature. The method may have a further characterization by which the second time duration is sufficient to redistribute at least a portion of a charge on the charge storage elements to neighboring charge storage elements. The method may have a further characterization by which charge stored by the memory cells after the over-programming is at least 30% greater than charge stored by the memory cells during normal use. The method may further include data retention capability of at least some of the memory cells after the exposing the semiconductor wafer to the elevated temperature. The method may have a further characterization by which the second time duration is at least one hour.

Disclosed also is a semiconductor device that includes a plurality of memory cells and each memory cell includes a gate. Each memory cell further includes an active region. memory cell further includes an inactive region. memory cell further includes a plurality of discrete storage elements, wherein a first subset of the discrete storage elements are positioned in the active region where the first subset of the discrete storage elements are exposed to charge from the active region and a second subset of the memory cells that are positioned in the inactive region and adjacent to the first subset of the discrete storage elements where the second subset of the discrete storage elements are not exposed to charge from the active region. The semiconductor device has a further characterization by which wherein the second subset of the discrete storage elements are holding a median charge after an erase operation, wherein the median charge is at least 10% of a median programming charge per discrete storage element for the first subset of the discrete storage elements. The semiconductor device may have a further characterization by which the memory cells are thin film storage memory cells. The semiconductor device may have a further characterization by which the discrete storage elements are nanocrystals. The semiconductor device further include shallow trench isolation oxide in the inactive region. The semiconductor device may have a further characterization by which the discrete memory cells are multilevel memory cells configured to store different levels of charge.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Thin film storage may refer to a memory type different than those specifically mentioned. In such case the over-programming would be greater than the highest threshold voltage. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   over-programming thin film storage (TFS) non-volatile memory cells having a plurality of nanocrystals on a semiconductor wafer with a first voltage that is higher than a highest voltage used to program the TFS non-volatile memory cells during normal operation of the memory cells, wherein over-programming includes additional electron accumulation in the plurality of nanocrystals such that the TFS non-volatile memory cells have a higher threshold voltage than would be if normal programming was performed; and
   before singulating the semiconductor wafer into individual die and with the TFS non-volatile memory cells in an over-programmed state, exposing the semiconductor wafer to a first temperature above a product specification temperature for a period of time sufficient to induce redistribution of charge among storage elements in the TFS non-volatile memory cells.

2. The method of claim 1, wherein the period of time is inversely proportional to the temperature.

3. The method of claim 1, further comprising probing the wafer to determine whether any of the TFS non-volatile memory cells are defective before the over-programming the TFS non-volatile memory cells.

4. The method of claim 3, wherein the over-programming is performed on the TFS non-volatile memory cells at least 30% above normal operating levels during customer use.

5. The method of claim 1, further comprising: verifying data retention capability of at least some of the TFS non-volatile memory cells after the exposing the wafer to the first temperature.

6. The method of claim 1, further comprising: singulating the semiconductor wafer into a plurality of individual die.

7. The method of claim 1, wherein the first temperature is at least a maximum specification temperature during which the individual die will be used.

8. The method of claim 1, wherein the first temperature is at least 175 degrees Celsius.

9. The method of claim 1, further comprising while exposing the semiconductor wafer to a first temperature, accumulating electrons on at least a first portion of the plurality of nanocrystals over isolation regions of the TFS non-volatile memory cells.

10. The method of claim 9, further comprising after exposing the semiconductor wafer to a first temperature, erasing the TFS non-volatile memory cells such that a second portion of the plurality nanocrystals over an active region of the TFS non-volatile memory cells are positively charged and the first portion of the plurality of nanocrystals over isolation regions of the TFS non-volatile memory cells are substantially unchanged.

11. A method comprising:
over-programming charge storage elements having a plurality nanocrystals in non-volatile memory cells on a semiconductor wafer at a first voltage and a first time duration, the over-programming to accumulate additional electrons in the plurality of nanocrystals such that the non-volatile memory cells have a higher threshold voltage than would be if normal programming was performed, and wherein the first voltage is greater than a maximum voltage that is specified to program the charge storage elements during normal operation and the first time duration is greater than a maximum time that is specified to program the charge storage elements during normal operation; and after the over-programming, exposing the semiconductor wafer to an elevated temperature for a second time duration, wherein the elevated temperature is at least as high as a maximum operating temperature for die on the semiconductor wafer.

12. The method of claim 11, further comprising:
probing the semiconductor wafer to detect defective non-volatile memory cells on the semiconductor wafer before the over-programming, wherein the over-programming is performed on non-volatile memory cells that are not defective.

13. The method of claim 11, wherein the non-volatile memory cells are in an over-programmed state when the semiconductor wafer is exposed to the elevated temperature.

14. The method of claim 11, wherein the second time duration is sufficient to redistribute at least a portion of a charge on the charge storage elements to neighboring charge storage elements.

15. The method of claim 11, wherein charge stored by the non-volatile memory cells after the over-programming is at least 30% greater than charge stored by the non-volatile memory cells during normal use.

16. The method of claim 11, further comprising:
verifying data retention capability of at least some of the non-volatile memory cells after the exposing the semiconductor wafer to the elevated temperature.

17. The method of claim 11, wherein the second time duration is at least one hour.

18. The method of claim 11, further comprising while exposing the semiconductor wafer to an elevated temperature, accumulating electrons on at least a first portion of the plurality of nanocrystals over isolation regions of the non-volatile memory cells.

19. The method of claim 18, further comprising after exposing the semiconductor wafer to an elevated temperature, erasing the non-volatile memory cells such that a second portion of the plurality nanocrystals over an active region of the non-volatile memory cells are positively charged and the first portion of the plurality of nanocrystals over isolation regions of the non-volatile memory cells are substantially unchanged.

20. The method of claim 11, wherein the higher threshold voltage is at least a 25% higher threshold voltage than would be if normal programming was performed.

* * * * *